(12) United States Patent
Abe et al.

(10) Patent No.: US 7,309,877 B2
(45) Date of Patent: Dec. 18, 2007

(54) SEMICONDUCTOR DEVICE, REFLECTION TYPE LIQUID CRYSTAL DISPLAY DEVICE, AND REFLECTION TYPE LIQUID CRYSTAL PROJECTOR

(75) Inventors: Hitoshi Abe, Kanagawa (JP); Toshihiko Orii, Kanagawa (JP); Osamu Akimoto, Tokyo (JP); Toshihiko Mochida, Kagoshima (JP); Shodai Nakayama, Nagasaki (JP)

(73) Assignee: Sony Corporation, Tokyo (JP)

( * ) Notice: Subject to any disclaimer, the term of this patent is extended or adjusted under 35 U.S.C. 154(b) by 54 days.

(21) Appl. No.: 10/485,634

(22) PCT Filed: Jun. 11, 2003

(86) PCT No.: PCT/JP03/07408

§ 371 (c)(1),
(2), (4) Date: Jun. 29, 2004

(87) PCT Pub. No.: WO03/104883

PCT Pub. Date: Dec. 18, 2003

(65) Prior Publication Data

US 2004/0232416 A1 Nov. 25, 2004

(30) Foreign Application Priority Data

Jun. 11, 2002 (JP) .............................. 2002-169861

(51) Int. Cl.
*H01L 31/036* (2006.01)
(52) U.S. Cl. .................. 257/59; 257/72; 257/E27.111; 349/48
(58) Field of Classification Search .................. 257/58, 257/59, 60, 61, 69, 70, 71, 72, 68; 340/781; 349/101, 117, 44
See application file for complete search history.

(56) References Cited

U.S. PATENT DOCUMENTS

| 4,523,189 | A | * | 6/1985 | Takahara et al. .............. 345/80 |
| 5,245,452 | A | | 9/1993 | Nakamura et al. |
| 5,578,849 | A | * | 11/1996 | Tadaki et al. ................ 257/298 |

(Continued)

FOREIGN PATENT DOCUMENTS

JP 55-164876 12/1980

(Continued)

*Primary Examiner*—Sue A. Purvis
*Assistant Examiner*—Fazli Erdem
(74) *Attorney, Agent, or Firm*—Sonnenschein Nath & Rosenthal LLP

(57) ABSTRACT

Disclosed is a semiconductor device capable of realizing a reduction in the area of each pixel without degrading noise resistance. A switching transistor (13) and a signal accumulation capacitor (15) are formed on a semiconductor substrate (base semiconductor region) (11) of a first conduction type, on the basis of each unit region for constituting a pixel Px. The switching transistor (13) has a structure in which a source region (13S) and a drain region (13D) of a second conduction type are formed on the semiconductor substrate (11), and a gate electrode (13G) is formed on the region between the source region (13S) and the drain region (13D), with an insulating layer (12a) therebetween. The signal accumulation capacitor (15) has a structure in which high-concentration semiconductor regions (15D) and (15S) of the first conduction type are formed on the semiconductor substrate (11), and an electrode (15G) is formed on the region between the semiconductor regions (15D) and (15S), with an insulating layer (12b) therebetween. A structure may be adopted in which a bias semiconductor region (17) is not provided, and the semiconductor regions (15D) and (15S) are made to serve also as the bias semiconductor region.

5 Claims, 6 Drawing Sheets

U.S. PATENT DOCUMENTS

| | | |
|---|---|---|
| 5,672,888 A | 9/1997 | Nakamura |
| 6,133,976 A | 10/2000 | Kimura |
| 6,501,523 B2 * | 12/2002 | Hirota et al. ............... 349/117 |
| 6,521,913 B1 * | 2/2003 | Murade ....................... 257/59 |
| 6,825,496 B2 * | 11/2004 | Yamazaki et al. ............. 257/72 |
| 2002/0070382 A1 * | 6/2002 | Yamazaki et al. ............. 257/72 |

FOREIGN PATENT DOCUMENTS

| | | |
|---|---|---|
| JP | 55164876 A | 12/1980 |
| JP | 61-119072 | 6/1986 |
| JP | 61119072 A | 6/1986 |
| JP | 62-010619 | 1/1987 |
| JP | 62-10619 | 1/1987 |
| JP | 02-32562 | 2/1990 |
| JP | 10-39332 | 2/1998 |
| JP | 10-039332 | 2/1998 |
| JP | 10039332 A | 2/1998 |
| JP | 10-293323 | 11/1998 |
| JP | 10293323 A | 11/1998 |
| JP | 11-15021 | 1/1999 |
| JP | 11-015021 | 1/1999 |

* cited by examiner

SEMICONDUCTOR DEVICE, REFLECTION TYPE LIQUID CRYSTAL DISPLAY DEVICE, AND REFLECTION TYPE LIQUID CRYSTAL PROJECTOR

BACKGROUND OF THE INVENTION

The present invention relates to a semiconductor device for constituting an active matrix drive portion in a reflection type liquid crystal display apparatus for active matrix display, a reflection type liquid crystal display apparatus for active matrix display, and a reflection type liquid crystal projector using a reflection type liquid crystal display apparatus for active matrix display.

As a reflection type liquid crystal display apparatus for active matrix display, the one shown in FIG. 7 has been considered.

The reflection type liquid crystal display apparatus 9 is comprised, as a whole, of a liquid crystal layer 33 formed by injecting a liquid crystal between a semiconductor device portion 50 constituting an active matrix drive portion and a counter transparent substrate 32 provided with a counter transparent electrode 31 functioning in common for each pixel.

The semiconductor device portion 50 comprises a semiconductor substrate (base semiconductor region) 11 such as a silicon substrate of a first conduction type, for example, P type, on which switching transistors 13 and signal accumulation capacitors 55 are provided on the basis of each unit region for constituting a pixel Px.

The switching transistor 13 is configured as a MIS (Metal Insulator Semiconductor) type or MOS (Metal Oxide Semiconductor) type transistor in which a source region 13S and a drain region 13D of a second conduction type (namely, of N type where the semiconductor substrate 11 is of P type) are formed on the semiconductor substrate 11, and a gate electrode 13G formed of polysilicon or the like is formed on the region between the source region 13S and the drain region 13D, with a thin insulating layer 12a therebetween which constitutes a part of an insulating layer 12 formed of silicon dioxide or the like.

The signal accumulation capacitor 55 is configured as a MIS type or MOS type transistor in which semiconductor regions 55D and 55S of the same second conduction type as that of the source region 13S and the drain region 13D of the switching transistor 13 (namely, of N type where the semiconductor substrate 11 is of P type) are formed on the semiconductor substrate 11, and an electrode 55G is formed on the region between the semiconductor regions 55D and 55S, with a thin insulating layer 12b therebetween which constitutes a part of the insulating layer 12. With an appropriate potential impressed on the semiconductor regions 55D and 55S, a channel 55c is formed at a portion beneath the electrode 55G between the semiconductor regions 55D and 55S, and a capacitance is formed.

Furthermore, high-concentration bias semiconductor regions 57 of the same first conduction type as that of the semiconductor substrate 11 (namely, of P type where the semiconductor substrate 11 is of P type), for impressing a bias potential such as earth potential on the semiconductor substrate 11, are formed on the semiconductor substrate 11 on the basis of each unit region constituting a pixel Px.

In addition, on an insulating layer 14 formed on the insulating layer 12, a scan line (scan electrode) 21 is formed in connection with the gate electrode 13G of the switching transistor 13, a signal line (signal electrode) 23 is formed in connection with the source region 13S of the switching transistor 13, a wiring 25 is formed for interconnection between the drain region 13D of the switching transistor 13 and the electrode 55G of the signal accumulation capacitor 55, and a bias electrode 59 is formed in connection with the semiconductor regions 55D and 55S of the signal accumulation capacitor 55 and with the bias semiconductor region 57.

Furthermore, on an insulating layer 16 formed on the insulating layer 14, a reflection electrode 19 for constituting a pixel electrode is formed in connection with the wiring 25, i.e., in connection with the drain region 13D of the switching transistor 13 and the electrode 55G of the signal accumulation capacitor 55.

The reflection type liquid crystal display apparatus 9 has a structure in which a multiplicity of the scan lines 21 are arranged in a vertical direction of a display screen, a multiplicity of the signal lines 23 are arranged in a horizontal direction of the display screen, and each of the portions at intersections of the scan lines 21 and the signal lines 23 is constituted as the pixel Px as above-mentioned.

With the bias electrode 59 earthed, an earth potential impressed on the semiconductor regions 55D and 55S of the signal accumulation capacitor 55 and the bias semiconductor region 57, and with a predetermined potential impressed on the counter transparent electrode 31 functioning in common for each pixel, the scan lines 21 are sequentially selected by a scan line drive circuit, and a predetermined potential is impressed on the gate electrode 13G of the switching transistor 13 for the pixel connected to the scan line 21 thus selected, whereby the switching transistor 13 for the pixel under consideration is turned ON, and a signal voltage is impressed on the source region 13S of the switching transistor 13 for the pixel in consideration through the signal line 23 by a signal line drive circuit, whereby a signal charge is accumulated in the capacitance of the signal accumulation capacitor 55 for the pixel under consideration through the drain region 13D of the switching transistor 13 for the pixel under consideration.

The signal charge thus accumulated is impressed on the reflection electrode 19 for the pixel under consideration, an electric field according to the signal voltage is impressed between the counter transparent electrode 31 functioning in common for each pixel and the reflection electrode 19 for the pixel under consideration, and, according to this, the rotatory polarization of light at the portion of the pixel under consideration is controlled by the liquid crystal layer 33. Then, the light which is incident on the reflection type liquid crystal display apparatus 9 from the outside of the counter transparent substrate 32, is transmitted through the portion of the pixel under consideration of the liquid crystal layer 33, is reflected by the reflection electrode 19, is again transmitted through the portion of the pixel under consideration of the liquid crystal layer 33 and goes out to the outside of the counter transparent substrate 32 is modulated, and the light in a predetermined polarization direction is transmitted, whereby an image is displayed on the reflection type liquid crystal display apparatus 9.

However, in the semiconductor device portion 50 in the reflection type liquid crystal display apparatus 9 according to the related art shown in FIG. 7 and described above, the semiconductor regions 55D and 55S constituting the signal accumulation capacitor 55 are of a conduction type different from that of the semiconductor substrate (base semiconductor region) 11, i.e., they are of the same conduction type as that of the source region 13S and the drain region 13D of the switching transistor 13. Therefore, for separation between the switching transistor region and the signal accumulation capacitor region, the distance between the switching transistor region and the signal accumulation capacitor region, i.e., the distance d between the drain region 13D of the switching transistor 13 and the semiconductor region 55D of the signal accumulation capacitor 55 must be large at least to a certain extent. As a result, the area of the pixel Px is large, and the number of pixels which can be formed in a predetermined size is small.

In addition, since the semiconductor regions 55D and 55S constituting the signal accumulation capacitor 55 are of a conduction type different from that of the semiconductor substrate (base semiconductor region) 11, the bias semiconductor region 57 of the same conduction type as that of the semiconductor substrate 11, for impressing a bias potential such as an earth potential on the semiconductor substrate 11, must be formed on the semiconductor substrate 11; accordingly, the area of the pixel Px is enlarged and the number of pixels which can be formed in a predetermined size is reduced.

When the area of the bias semiconductor region 57 is reduced for minimizing the enlargement of the area of the pixel Px, a bias potential cannot be stably impressed on the semiconductor substrate 11, and noise resistance is degraded.

Accordingly, the present invention aims at realizing a reduction in the area of a pixel without degrading noise resistance.

SUMMARY OF THE INVENTION

In accordance with a first aspect of the invention, there is provided a semiconductor device wherein:

a switching transistor and a signal accumulation capacitor are formed on a base semiconductor region of a first conduction type on the basis of each unit region for constituting a pixel;

the switching transistor has a configuration in which a source region and a drain region of a second conduction type are formed on the base semiconductor region, and a gate electrode is formed on the region between the source region and the drain region, with an insulating layer therebetween;

the signal accumulation capacitor has a configuration in which two semiconductor regions of the first conduction type are formed on the base semiconductor region, and an electrode is formed on the region between the two semiconductor regions, with an insulating layer therebetween; and a scan line is formed in connection with the gate electrode of the switching transistor, a signal line is formed in connection with the source region of the switching transistor, and a reflection electrode for constituting a pixel electrode is formed in connection with the drain region of the switching transistor and the electrode of the signal accumulation capacitor.

In accordance with a second aspect of the invention, there is provided a semiconductor device wherein:

a switching transistor and a signal accumulation capacitor are formed on a base semiconductor region of a first conduction type on the basis of each unit region for constituting a pixel;

the switching transistor has a configuration in which a source region and a drain region of a second conduction type are formed on the base semiconductor region, and a gate electrode is formed on the region between the source region and the drain region, with an insulating layer therebetween;

the signal accumulation capacitor has a configuration in which an electrode is formed on a region, adjacent to the drain region of the switching transistor, of the base semiconductor region, with an insulating layer therebetween; and a bias semiconductor region of the first conduction type connected to the electrode of the signal accumulation capacitor is formed on the base semiconductor region, with a bias electrode therebetween, a scan line is formed in connection with the gate electrode of the switching transistor, a signal line is formed in connection with the source region of the switching transistor, and a reflection electrode for constituting a pixel electrode is formed in connection with the drain region of the switching transistor.

In the semiconductor device according to the first aspect of the invention configured as above, the semiconductor region for constituting the signal accumulation capacitor is of the same conduction type as that of the base semiconductor region, i.e., of a conduction type different from that of the source region and the drain region of the switching transistor. Therefore, for separation between the switching transistor region and the signal accumulation capacitor region, the distance between the switching transistor region and the signal accumulation capacitor region, i.e., the distance between the drain region of the switching transistor and the semiconductor region on the switching transistor side of the signal accumulation capacitor can be made to be sufficiently small, whereby the area of the pixel can be reduced, and the number of pixels which can be formed in a predetermined size can be enlarged.

In this case, the reduction in the area of the pixel can be realized in the same manner as above also by forming a bias semiconductor region of the first conduction type on the base semiconductor region, separately from the semiconductor region for constituting the signal accumulation capacitor. Since the semiconductor region for constituting the signal accumulation capacitor is of the same conduction type as that of the base semiconductor region, when the semiconductor region for constituting the signal accumulation capacitor is made to serve also as the bias semiconductor region of the base semiconductor region, the area of the pixel can be further reduced, and the number of pixels which can be formed in a predetermined size can be further enlarged.

In the semiconductor device according to the second aspect of the invention configured as above, the signal accumulation capacitor is constituted by forming the electrode on the region, adjacent to the drain region of the switching transistor, of the base semiconductor region, with the insulating layer therebetween, and a semiconductor region for constituting the signal accumulation capacitor is not formed on the base semiconductor region separately from the drain region of the switching transistor. Therefore, even where the bias semiconductor region is formed on the base semiconductor region, the area of the pixel can be reduced, and the number of pixels which can be formed in a predetermined size can be enlarged.

In addition, according to the present invention, there is provided a reflection type liquid crystal display apparatus wherein a liquid crystal layer is formed between the above-described semiconductor device and a counter transparent substrate provided with a counter electrode functioning in common for each pixel.

Furthermore, according to the present invention, there is provided a reflection type liquid crystal projector which comprises the above-described reflection type liquid crystal display apparatus, and in which light emitted from a light source is modulated based on a picture signal by the reflection type liquid crystal display apparatus, and picture light outputted through the modulation is projected through a projection lens.

DETAILED DESCRIPTION OF THE PRESENTLY PREFERRED EMBODIMENTS

Embodiments of Semiconductor Device and Reflection Type Liquid Crystal Display Apparatus: FIGS. 1 to 5

Figure 1:
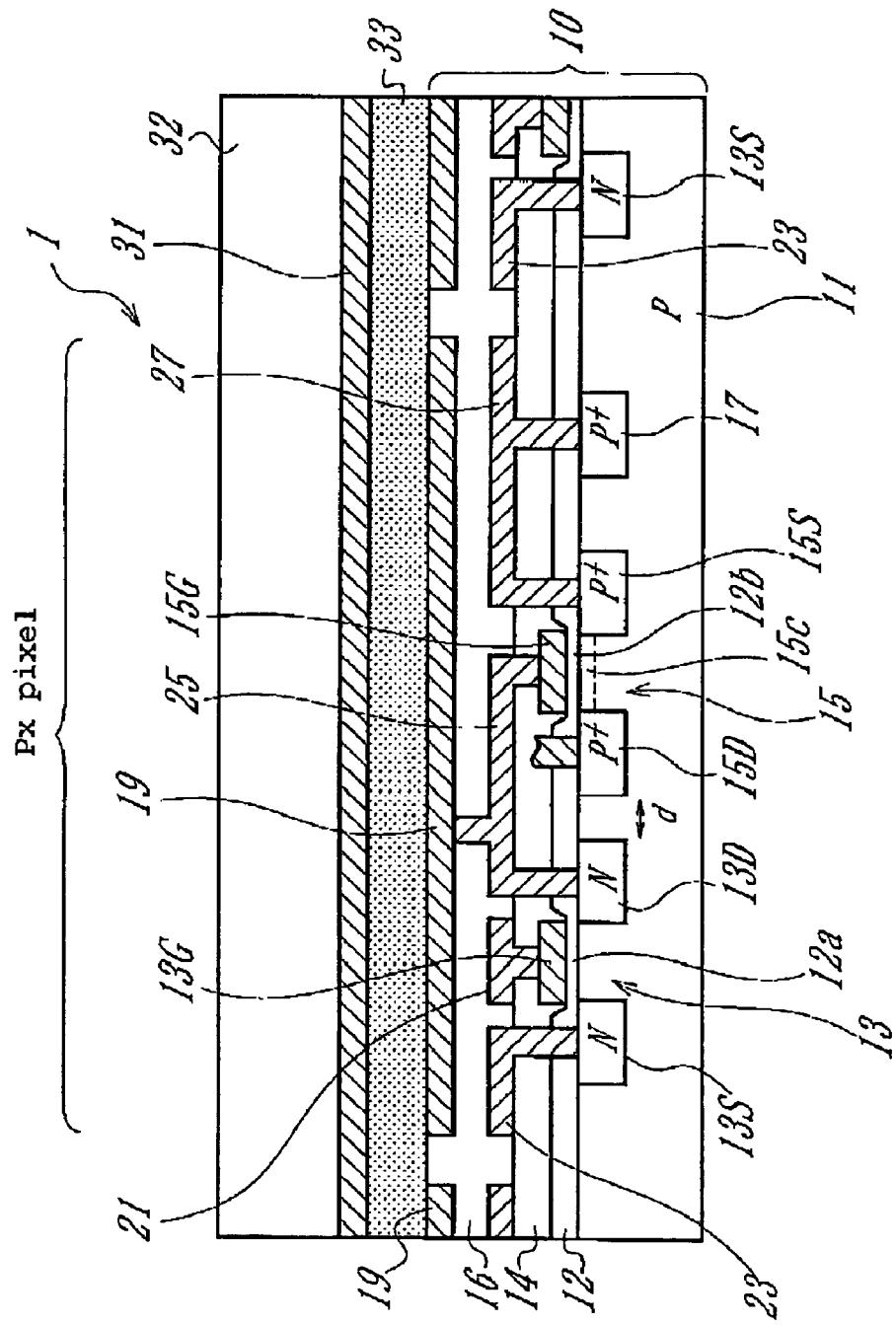
FIG. 1 is a sectional view showing a first embodiment of a reflection type liquid crystal display apparatus according to the present invention.

First Embodiment: FIG. 1

FIG. 1 illustrates a first embodiment of the reflection type liquid crystal display apparatus according to the present invention which comprises as a semiconductor device portion a first embodiment of the semiconductor device according to the present invention.

The reflection type liquid crystal display apparatus 1 according to this embodiment has, as a whole, a configuration in which a liquid crystal layer 33 is formed by injecting a liquid crystal between a semiconductor device portion 10 for constituting an active matrix drive portion and a counter transparent substrate 32 provided with a counter transparent electrode 31 functioning in common for each pixel.

The semiconductor device portion 10 has a configuration in which a switching transistor 13 and a signal accumulation capacitor 15 are formed on a semiconductor substrate (base semiconductor region) 11 such as a silicon substrate of a first conduction type, for example, P type, on the basis of each unit region for constituting a pixel Px.

The switching transistor 13 is constituted as a MIS type or MOS type transistor in which a source region 13S and a drain region 13D of a second conduction type (namely, of N type where the semiconductor substrate 11 is of P type) are formed on the semiconductor substrate 11, and a gate electrode 13G formed of polysilicon or the like is formed on the region between the source region 13S and the drain region 13D, with a thin insulating layer 12a therebetween which constitutes a part of an insulating layer 12 formed of silicon dioxide or the like.

The signal accumulation capacitor 15 is constituted as a MIS type or MOS type transistor in which high-concentration semiconductor regions 15D and 15S of the same first conduction type as that of the semiconductor substrate 11 (namely, of P type where the semiconductor substrate 11 is of P type) are formed on the semiconductor substrate 11, and an electrode 15G is formed on the region between the semiconductor regions 15D and 15S, with a thin insulating layer 12b therebetween which constitutes a part of the insulating layer 12. With an appropriate potential impressed on the semiconductor regions 15D and 15S, a channel 15c is formed at a portion beneath the electrode 15G between the semiconductor regions 15D and 15S, and a capacitance is formed.

In this embodiment, further, a high-concentration bias semiconductor region 17 of the same first conduction type as that of the semiconductor substrate 11 (namely, of P type where the semiconductor substrate 11 is of P type), for impressing a bias potential such as an earth potential on the semiconductor substrate 11, is formed on the semiconductor substrate 11 on the basis of each unit region for constituting the pixel Px.

Besides, on an insulating layer 14 formed on the insulating layer 12, a scan line (scan electrode) 21 is formed in connection with the gate electrode 13G of the switching transistor 13, a signal line (signal electrode) 23 is formed in connection with the source region 13S of the switching transistor 13, a wiring 25 is formed for interconnection between the drain region 13D of the switching transistor 13 and the electrode 15G of the signal accumulation capacitor 15, and a bias electrode 27 is formed in connection with the semiconductor regions 15D and 15S of the signal accumulation capacitor 15 and the bias semiconductor region 17.

Furthermore, on an insulating layer 16 formed on the insulating layer 14, a reflection electrode 19 for constituting a pixel electrode is formed in connection with the wiring 25, i.e., in connection with the drain region 13D of the switching transistor 13 and the electrode 15G of the signal accumulation capacitor 15.

Figure 4:
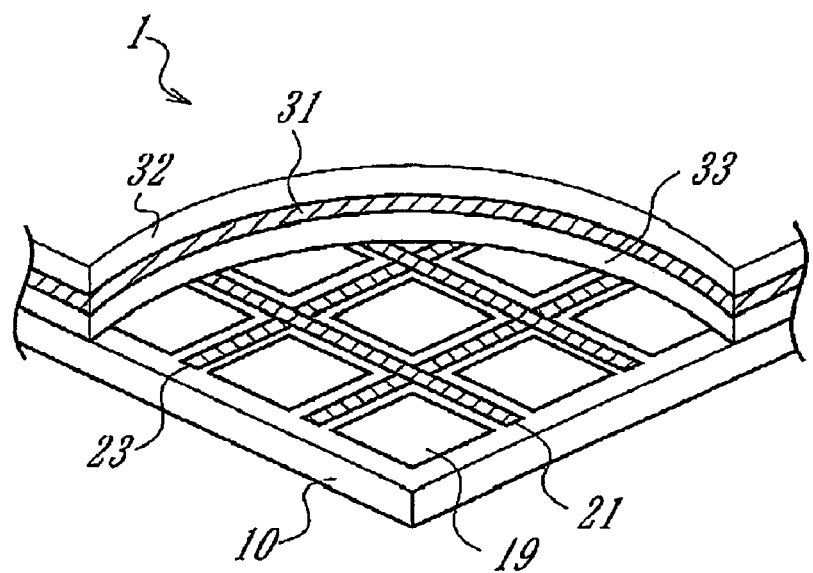
FIG. 4 is a perspective view showing a general configuration of the reflection type liquid crystal display apparatus according to the present invention.

As shown in FIG. 4, the reflection type liquid crystal display apparatus 1 has a configuration in which a multiplicity of scan lines 21 are arranged in a vertical direction of a display screen, a multiplicity of signal lines 23 are arranged in a horizontal direction of the display screen, and the portion of each of the intersections of the scan lines 21 and the signal lines 23 is constituted as a pixel Px as above-described.

Figure 5:
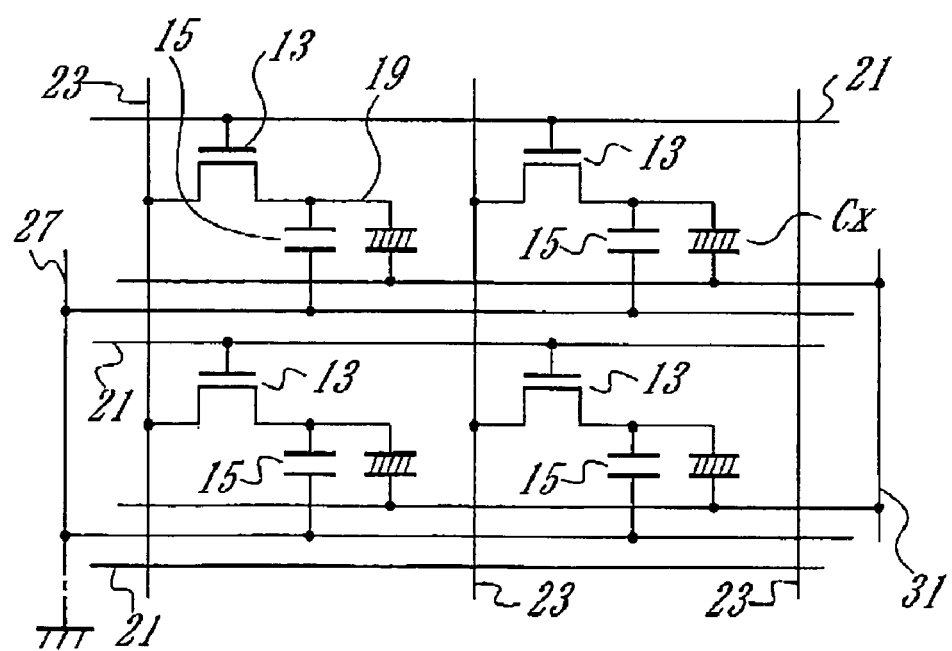
FIG. 5 is a connection view showing a circuit configuration of the reflection type liquid crystal display apparatus according to the present invention.

As shown in FIG. 5, a drive circuit is so constituted that with the bias electrodes 27 earthed, with the earth potential impressed on the semiconductor regions 15D and 15S of the signal accumulation capacitors 15 and the bias semiconductor regions 17, and with a predetermined potential impressed on the counter transparent electrode 31 functioning in common for each pixel, the scan lines 21 are sequentially selected by a scan line drive circuit, and a predetermined potential is impressed on the gate electrode 13G of the switching transistor 13 for the pixel connected to the scan line 21 thus selected, whereby the switching transistor 13 for the pixel under consideration is turned ON, and a signal voltage is impressed on the source region 13S of the switching transistor 13 for the pixel under consideration through the signal line 23 by a signal line drive circuit, whereby a signal charge is accumulated in the capacitance of the signal accumulation capacitor 15 for the pixel under consideration through the drain region 13D of the switching transistor 13 for the pixel under consideration.

The signal charge thus accumulated is impressed on the reflection electrode 19 for the pixel under consideration, and an electric field according to the signal voltage is impressed between the counter transparent electrode 31 functioning in common for each pixel and the reflection electrode 19 for the pixel under consideration. According to this, the rotatory polarization state of the liquid crystal at the portion of the pixel under consideration having a liquid crystal capacity Cx of the liquid crystal layer 33 is controlled, and the light which is incident on the reflection type liquid crystal display apparatus 1 from the outside of the counter transparent substrate 32, is transmitted, through the portion of the pixel under consideration of the liquid crystal layer 33, is reflected by the reflection electrode 19, is again transmitted through the portion of the pixel under consideration of the liquid crystal layer 33 and goes out to the outside of the counter transparent substrate 32 is modulated, and the light in a predetermined polarization direction is outputted, whereby an image is displayed on the reflection type liquid crystal display apparatus 1.

In the reflection type liquid crystal display apparatus 1 and the semiconductor device portion 10 according to the embodiment shown in FIG. 1, the semiconductor regions 15D and 15S for constituting the signal accumulation capacitor 15 are of the same conduction type as that of the semiconductor substrate (base semiconductor region) 11, i.e., of the conduction type different from that of the source region 13S and the drain region 13D of the switching transistor 13. Therefore, for separation between the switching transistor region and the signal accumulation capacitor region, the distance between the switching transistor region and the signal accumulation capacitor region, i.e., the distance d between the drain region 13D of the switching transistor 13 and the semiconductor region 15D of the signal accumulation capacitor 15 can be made to be sufficiently small, whereby the area of the pixel Px can be reduced, and the number of pixels which can be formed in a predetermined size can be enlarged.

Moreover, not only the bias semiconductor region 17 but also the semiconductor regions 15D and 15S for constituting the signal accumulation capacitors 15 are used as the regions for impressing the bias potential on the semiconductor substrate 11; accordingly, the bias potential is stably impressed on the semiconductor substrate 11, and noise resistance is enhanced.

Incidentally, a bias potential different from the earth potential may be impressed on the semiconductor regions 15D and 15S of the signal accumulation capacitor 15 and the bias semiconductor region 17.

Besides, on the contrary to the embodiment shown in FIG. 1, the semiconductor substrate (base semiconductor region) 11, the semiconductor regions 15D and 15S of the signal accumulation capacitor 15 and the bias semiconductor region 17 may be of N type, while the source region 13S and the drain region 13D of the switching transistor 13 may be of P type.

Furthermore, instead of using the semiconductor substrate directly as the base semiconductor region and forming the source region and the drain region of the switching transistor, the semiconductor regions for constituting the signal accumulation capacitor, and the bias semiconductor region in the base semiconductor region, a configuration may be adopted in which, for example, a base semiconductor region of P type is formed on a semiconductor substrate of N type, and a source region and a drain region of N type for constituting the switching transistor, a semiconductor region of P type for constituting the signal accumulation capacitor, and a bias semiconductor region of P type are formed on the base semiconductor region of the P type.

Figure 2:
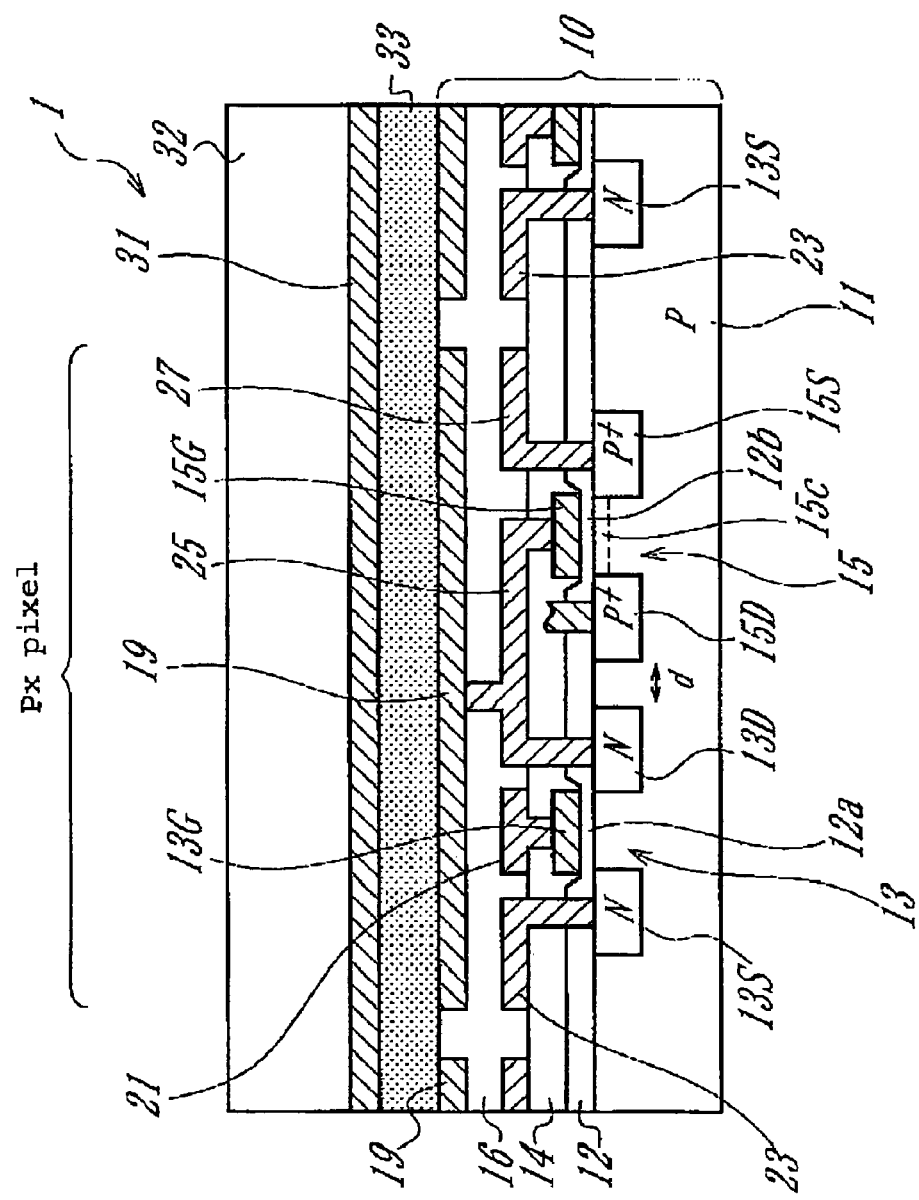
FIG. 2 is a sectional view showing a second embodiment of the reflection type liquid crystal display apparatus according to the present invention.

Second Embodiment: FIG. 2

FIG. 2 illustrates a second embodiment of the reflection type liquid crystal display apparatus according to the present invention which comprises as a semiconductor device portion a second embodiment of the semiconductor device according to the present invention.

In this embodiment, in the case of forming the switching transistor 13 and the signal accumulation capacitor 15 on the semiconductor substrate (base semiconductor region) 11 as in the embodiment shown in FIG. 1, a bias semiconductor region is not formed on the semiconductor substrate 11 separately from the high-concentration semiconductor regions 15D and 15S of the same conduction type as that of the semiconductor substrate 11 for constituting the signal accumulation capacitor 15, and, instead, the semiconductor regions 15D and 15S for constituting the signal accumulation capacitor 15 are made to serve also as the bias semiconductor region for impressing the bias potential on the semiconductor substrate 11.

Besides, a bias electrode 27 is formed on the insulating layer 14 in the state of being connected to the semiconductor regions 15D and 15S, and the bias electrode 27 is connected to a bias potential point such as an earth potential point, whereby a bias potential such as the earth potential is impressed on the semiconductor regions 15D and 15S. The other aspects are the same as in the embodiment shown in FIG. 1.

Therefore, in the embodiment shown in FIG. 2, like in the embodiment shown in FIG. 1, for separation between the switching transistor region and the signal accumulation capacitor region, the distance between the switching transistor region and the signal accumulation capacitor region, i.e., the distance between the drain region 13D of the switching transistor 13 and the semiconductor region 15D of the signal accumulation capacitor 15 can be made to be sufficiently small. In addition, the portion for forming the bias semiconductor region 17 in the embodiment shown in FIG. 1 can be cut from the pixel region. Therefore, as compared with the embodiment shown in FIG. 1, the area of the pixel Px can be further reduced, and the number of pixels which can be formed in a predetermined size can be further enlarged.

Moreover, the area of the pixel Px can be made to be sufficiently small, even without reducing the area of the semiconductor regions 15D and 15S of the signal accumulation capacitor 15 serving also as the bias semiconductor region. As a result, the bias potential is stably impressed on the semiconductor substrate 11, and noise resistance is enhanced.

Incidentally, on the contrary to the embodiment shown in FIG. 2, the semiconductor substrate (base semiconductor region) 11 and the semiconductor regions 15D and 15S of the signal accumulation capacitor 15 may be of N type, while the source region 13S and the drain region 13D of the switching transistor 13 may be of P type.

Moreover, instead of using the semiconductor substrate directly as the base semiconductor region and forming the source region and the drain region of the switching transistor and the semiconductor regions for constituting the signal accumulation capacitors in the base semiconductor region, a configuration may be adopted in which, for example, a base semiconductor region of P type is formed on a semiconductor substrate of N type, and a source region and a drain region of N type for constituting the switching transistor and semiconductor regions of P type for constituting the signal accumulation capacitor are formed on the base semiconductor region of the P type.

Figure 3:
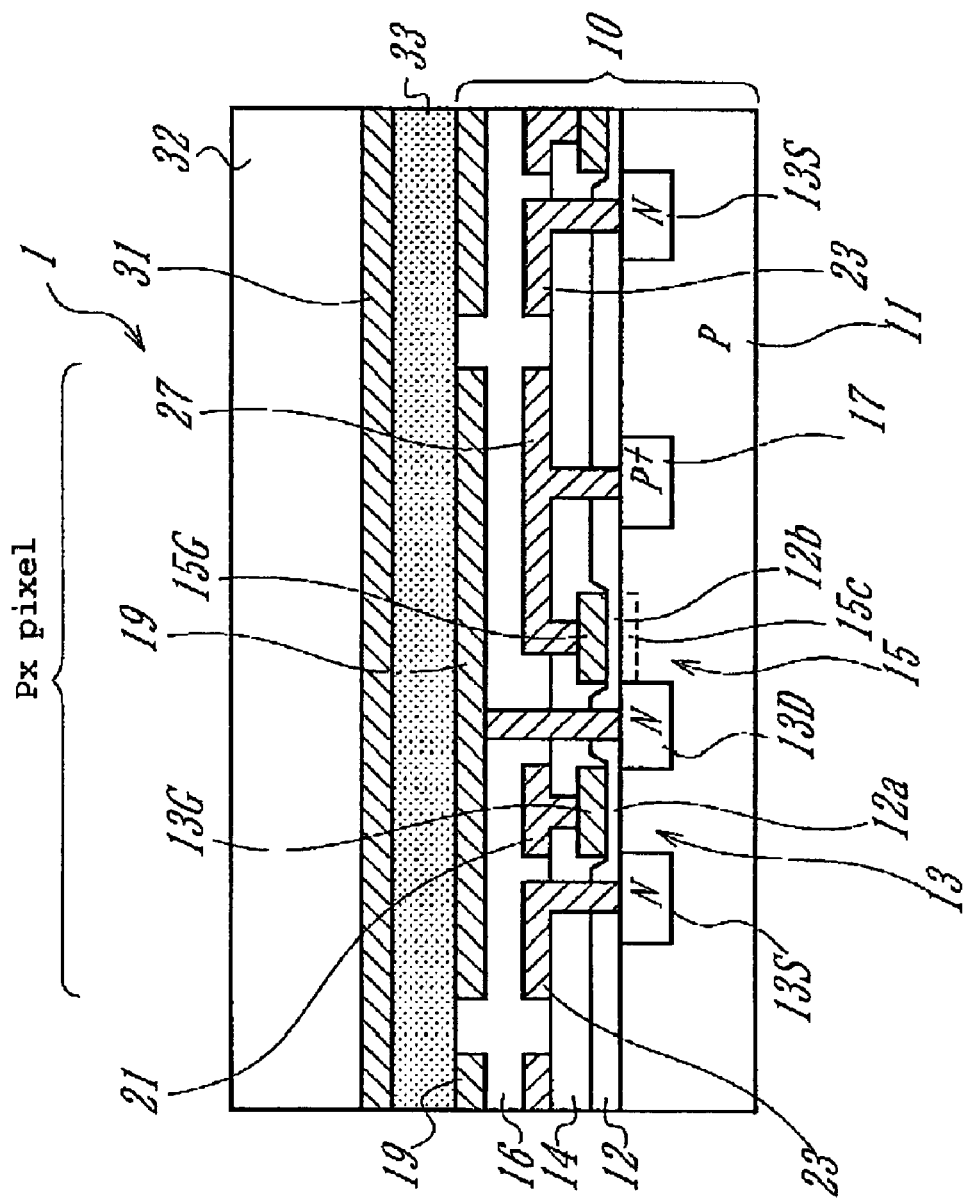
FIG. 3 is a sectional view showing a third embodiment of the reflection type liquid crystal display apparatus according to the present invention.

Third Embodiment: FIG. 3

FIG. 3 illustrates a third embodiment of the reflection type liquid crystal display apparatus according to the present invention which comprises as a semiconductor device portion a third embodiment of the semiconductor device according to the present invention.

In this embodiment, the switching transistor 13 is configured in the same manner as those in the embodiments shown in FIGS. 1 and 2. However, unlike in the embodiments shown in FIGS. 1 and 2, the signal accumulation capacitor 15 has a configuration in which an electrode 15G is formed on a region, adjacent to the drain region 13D of the switching transistor 13, of the semiconductor substrate (base semiconductor region) 11, with a thin insulating layer 12b therebetween which constitutes a part of the insulating layer 12. With an appropriate potential impressed on the electrode 15G, a channel 15c is formed at a portion beneath the electrode 15G adjacent to the drain region 13D, and a capacitance is formed.

In this embodiment, further, a high-concentration bias semiconductor region 17 of the same first conduction type as that of the semiconductor substrate 11 (namely, of P type where the semiconductor substrate 11 is of P type), for impressing a bias potential such as the earth potential on the semiconductor substrate 11, is formed on the semiconductor substrate 11 on the basis of each unit region for constituting a pixel Px.

Besides, on an insulating layer 14 formed on the insulating layer 12, a scan line 21 is formed in connection with the gate electrode 13G of the switching transistor 13, a signal line 23 is formed in connection with the source region 13S of the switching transistor 13, and a bias electrode 27 is formed in connection with the electrode 15G of the signal accumulation capacitor 15 and the bias semiconductor region 17. On an insulating layer 16 formed on the insulating layer 14, a reflection electrode 19 for constituting a pixel electrode is formed in connection with the drain region 13D of the switching transistor 13.

A drive circuit is so constituted that, as shown in FIG. 5, with the bias electrode 27 earthed, with the earth potential impressed on the electrode 15G of the signal accumulation capacitor 15 and the bias semiconductor region 17, and with a predetermined potential impressed on the counter transparent electrode 31 functioning in common for each pixel, the scan lines 21 are sequentially selected by a scan line drive circuit, and a predetermined potential is impressed on the gate electrode 13G of the switching transistor 13 for the pixel connected to the scan line 21 thus selected, whereby the switching transistor 13 for the pixel under consideration is turned ON, and a signal voltage is impressed on the source region 13S of the switching transistor 13 for the pixel under consideration through a signal line 23 by a signal line drive circuit, whereby a signal charge is accumulated in the capacitance of the signal accumulation capacitor 15 for the pixel under consideration through the drain region 13D of the switching transistor 13 for the pixel under consideration.

The signal charge thus accumulated is impressed on the reflection electrode 19 for the pixel under consideration, whereby an image is displayed on the reflection type liquid crystal display apparatus 1, in the same manner as in the embodiments shown in FIGS. 1 and 2.

In the reflection type liquid crystal display apparatus 1 and the semiconductor device portion 10 according to the embodiment shown in FIG. 3 constituted as above-described, a semiconductor region for constituting the signal accumulation capacitor 15 is not formed on the semiconductor substrate 11 separately from the drain region 13D of the switching transistor 13. Therefore, even though the bias semiconductor region 17 is formed on the semiconductor substrate 11, the area of the pixel Px can be reduced, and the number of pixels which can be formed in a predetermined size can be enlarged.

Incidentally, a bias potential different from the earth potential may be impressed on the electrode 15G of the signal accumulation capacitor 15 and the bias semiconductor region 17. In addition, bias potentials different from each other may be impressed respectively on the electrode 15G and the bias semiconductor region 17.

Besides, on the contrary to the embodiment shown in FIG. 3, the semiconductor substrate (base semiconductor region) 11 and the bias semiconductor region 17 may be of N type, while the source region 13S and the drain region 13D of the switching transistor 13 may be of P type.

Furthermore, instead of using the semiconductor substrate directly as the base semiconductor region and forming the source region and the drain region of the switching transistor and the bias semiconductor region in the base semiconductor region, a configuration may be adopted in which, for example, a base semiconductor region of P type is formed on a semiconductor substrate of N type, and a source region and a drain region of N type for constituting the switching transistor and a bias semiconductor region of P type are formed on the base semiconductor region of the P type.

Figure 6:
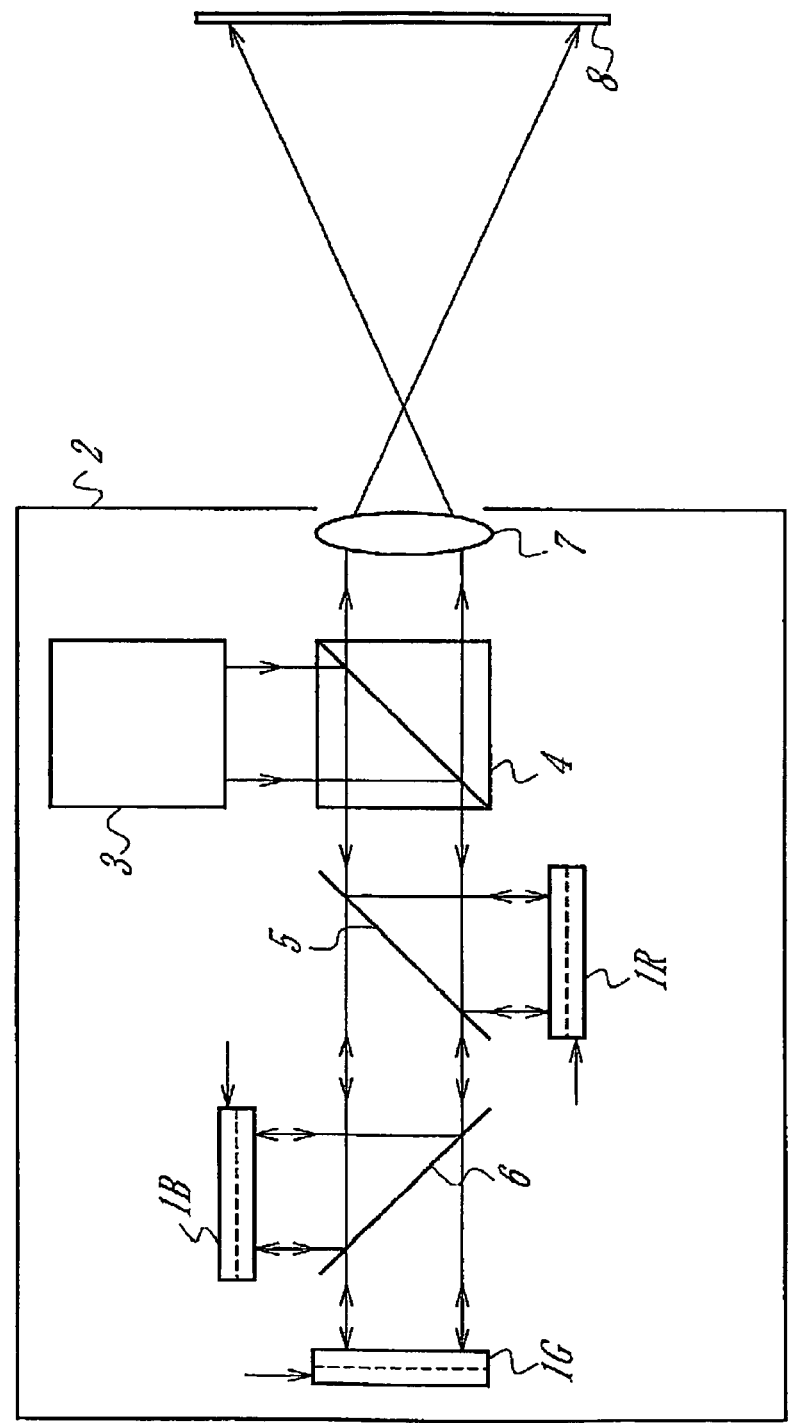
FIG. 6 illustrates an embodiment of a reflection type liquid crystal projector according to the present invention.
Figure 7:
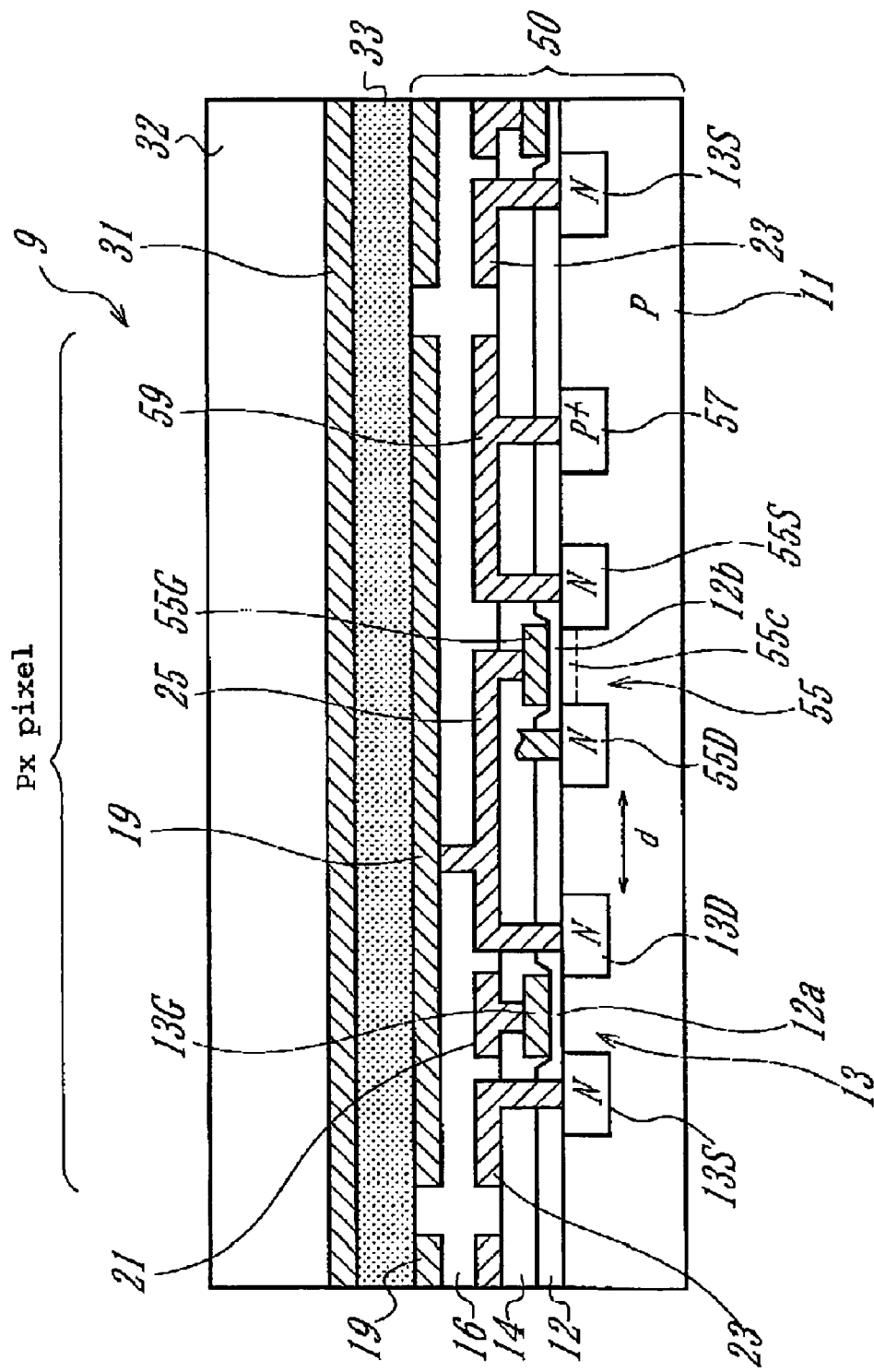
FIG. 7 is a sectional view showing a reflection type liquid crystal display apparatus according to the related art.

Embodiment of Reflection Type Liquid Crystal Projector: FIG. 6

The reflection type liquid crystal display apparatus according to the present invention, constituted as those in the above-described embodiments, can be used, for example, for a reflection type liquid crystal projector (projection type display apparatus).

FIG. 6 illustrates an embodiment of the reflection type liquid crystal projector according to the present invention, using the reflection type liquid crystal display apparatus according to the present invention.

In the reflection type liquid crystal projector 2 according to this embodiment, non-polarized white light as parallel rays having a uniform intensity distribution in a predetermined region on a plane orthogonal to the center of light beam is emitted from an illumination unit 3 comprising a white light source therein.

The light beam thus emitted is incident on a polarized light beam splitter 4, where it is split into a light beam of S polarized light reflected by the polarized light beam splitter 4, and a light beam of P polarized light transmitted through the polarized light beam splitter 4. The light beam of S polarized light reflected by the polarized light beam splitter 4 is incident on a red reflector 5, where red light in the light beam of S polarized light is reflected by the red reflector 5, whereas green light and blue light are transmitted through the red reflector 5. Further, the green light and blue light transmitted through the red reflector 5 are incident on a blue reflector 6, where the blue light is reflected by the blue reflector 6, whereas the green light is transmitted through the blue reflector 6.

Then, the red light reflected by the red reflector 5 is incident on a reflection type liquid crystal display apparatus 1R for red, the green light transmitted through the blue reflector 6 is incident on a reflection type liquid crystal display apparatus 1G for green, and the blue light reflected by the blue reflector 6 is incident on a reflection type liquid crystal display apparatus 1B for blue.

The reflection type liquid crystal display apparatuses 1R, 1G, and 1B are each a reflection type liquid crystal display apparatus according to the present invention, which is constituted as in the embodiment shown in FIG. 1, FIG. 2 or FIG. 3, and in which image data are written by red, green, and blue picture signals (color signals), respectively.

The red light incident on the reflection type liquid crystal display apparatus 1R, the green light incident on the reflection type liquid crystal display apparatus 1G, and the blue light incident on the reflection type liquid crystal display apparatus 1B are modulated respectively by the reflection type liquid crystal display apparatuses 1R, 1G, and 1B based on the picture signals, are then reflected, and again combined with each other by the red reflector 5 and the blue reflector 6. Of the modulated red, green, and blue light beams thus re-combined, the P polarized light component is transmitted through the polarized light beam splitter 4 as image light, which is enlargedly projected on a screen 8 by a projection lens 7.

In the reflection type liquid crystal projector 2 according to this embodiment, the area of each pixel in the reflection type liquid crystal display apparatuses 1R, 1G, and 1B can be reduced, and the number of pixels which can be formed in a predetermined size can be enlarged, as described above. Therefore, where the reflection type liquid crystal display apparatuses 1R, 1G, and 1B are manufactured in a predetermined size, the number of the pixels in the reflection type liquid crystal display apparatuses 1R, 1G, and 1B can be enlarged, and a high-resolution image can be projected on the screen 8. On the other hand, where the reflection type liquid crystal display apparatuses 1R, 1G, and 1B each comprise a predetermined number of pixels, the size of the reflection type liquid crystal display apparatuses 1R, 1G, and 1B can be reduced, and, hence, the size of the reflection type liquid crystal projector 2 can be reduced.

Incidentally, the reflection type liquid crystal projector according to the present invention is not limited to the one shown in the figure. It suffices for the reflection type liquid crystal projector to comprise an illumination optical system for emitting the light from a white light source in the form of a light beam having a uniform intensity distribution in a predetermined region on a plane orthogonal to the center of the light beam, a decomposing optical system for splitting the thus emitted light beam into a plurality of color light beams such as red, green and blue light beams, reflection type liquid crystal display apparatuses according to the present invention on which the thus split color light beams are respectively incident, a combining optical system for combining color image light beams emitted from the reflection type liquid crystal display apparatuses for the colors, and a projection optical system for projecting the combined image light on a screen. Besides, the reflection type liquid crystal projector may be constituted by use of a single-plate reflection type liquid crystal display apparatus, in place of the decomposing optical system and the combining optical system. Furthermore, a back projection type may be constituted, instead of the front projection type as in the embodiment shown in FIG. 6.

As has been described above, according to the present invention, it is possible to realize a reduction in the area of each pixel without degrading noise resistance.

The invention claimed is:

1. A semiconductor device having:
at least one pixel comprising:
a switching transistor which comprises a source region connected to a signal line and a drain region, both of which are of a first conductivity type and formed in a base semiconductor region of a second conductivity type, and a gate electrode formed on a region between said source region and said drain region, with an insulating layer therebetween, and connected to a scan line;
a signal accumulation capacitor formed in said base semiconductor region of said second conduction type, said signal accumulation capacitor includes two semiconductor regions of said second conductivity type formed in said base semiconductor region, and an electrode formed on a region between said two semiconductor regions, with an insulating layer therebetween;
a reflection electrode which serves as a pixel electrode is formed in connection with said drain region of said switching transistor and said electrode of said signal accumulation capacitor; and
a bias semiconductor region of said second conduction type is formed in said base semiconductor region, separately from said semiconductor regions constituting said signal accumulation capacitor.

2. A semiconductor device having:
at least one pixel comprising:
a switching transistor which comprises a source region connected to a signal line and a drain region, both of which are of a first conductivity type and are formed in a base semiconductor region of a second conductivity type, and a gate electrode formed on a region between said source region and said drain region, with an insulating layer therebetween, and connected to a scan line and
a signal accumulation capacitor formed in said base semiconductor region of said second conductivity type, said signal accumulation capacitor includes two semiconductor regions of said second conductivity type formed in said base semiconductor region, and an electrode formed on a region between said two semiconductor regions, with an insulating layer therebetween;
a reflection electrode serving as a pixel electrode is formed in connection with said drain region of said switching transistor and said electrode of said signal accumulation capacitor; and
said semiconductor regions constituting said signal accumulation capacitor are connected to a bias electrode, and serve also a bias semiconductor region formed in said base semiconductor region.

3. A semiconductor device having:
a pixel base unit comprising:
a switching transistor which comprises a source region connected to a signal line and a drain region, both of which are of a first conductivity type and formed in a base semiconductor region of a second conductivity type, and a gate electrode formed on a region between said source region and said drain region, with an insulating layer therebetween, and connected to a scan line;
a signal accumulation capacitor formed in said base semiconductor region of said second conductivity type, said signal accumulation capacitor comprises an electrode formed on a region, adjacent to said drain region of said switching transistor, of said base semiconductor region, with an insulating layer therebetween; and a bias semiconductor region of said second conductivity type is formed in said base semiconductor region in the state of being connected to said electrode of said signal accumulation capacitor through a bias electrode; and a reflection electrode for constituting a pixel electrode is formed in connection with said drain region of said switching transistor.

4. A reflection type liquid crystal display apparatus comprising a liquid crystal layer formed between a surface provided with said reflection electrode of a semiconductor device as set forth in any one of claims 1 to 3, and a surface, provided with a counter transparent electrode functioning in common for each pixel, of a counter transparent substrate disposed opposite to said semiconductor device.

5. A reflection type liquid crystal projector comprising a reflection type liquid crystal display apparatus as set forth in claim 4, wherein light emitted from a light source is modulated based on a picture signal by said reflection type liquid crystal display apparatus, and the light outputted through the modulation is projected through a projection lens.

* * * * *